United States Patent [19]
Gozzo

[11] Patent Number: 5,513,214
[45] Date of Patent: Apr. 30, 1996

[54] SYSTEM AND METHOD OF ESTIMATING EQUALIZER PERFORMANCE IN THE PRESENCE OF CHANNEL MISMATCH

[75] Inventor: Francesco Gozzo, Endicott, N.Y.

[73] Assignee: Loral Federal Systems Company, McLean, Va.

[21] Appl. No.: 514,356

[22] Filed: Jul. 27, 1995

Related U.S. Application Data

[63] Continuation of Ser. No. 281,547, Jul. 27, 1994, abandoned, which is a continuation of Ser. No. 846,651, Mar. 5, 1992, abandoned.

[51] Int. Cl.$^6$ .................................. H03H 7/30; H03H 7/40
[52] U.S. Cl. ............................ 375/232; 375/233; 375/346
[58] Field of Search ..................................... 375/229–236, 375/346, 350; 364/724.19, 724.2; 333/18, 28 R

[56] References Cited

U.S. PATENT DOCUMENTS

| | | | |
|---|---|---|---|
| 4,539,690 | 9/1985 | Speidel | 375/14 |
| 4,577,329 | 3/1986 | Brie et al. | 375/14 |
| 4,730,343 | 3/1988 | Kanemasa et al. | 375/14 |
| 4,789,994 | 12/1988 | Randall et al. | 375/12 |
| 4,985,902 | 1/1991 | Gurcan | 375/14 |
| 5,119,401 | 6/1992 | Tsujimoto | 375/14 |

OTHER PUBLICATIONS

S. Qureshi, "Adaptive Equalization," Proc. of the IEEE, vol. 73, No. 9, pp. 1349–1387, Sep. 1985.
J. Proakis, Digital Communications, New York: McGraw Hill, 1989.
G. W. Davidson, D. D. Falconer and A. U. H. Sheikh, "An Investigation of Block–adaptive Decision Feedback Equalization for Frequency Selective Fading Channels," Canadian Journ. Elec. and Comp. Eng., vol. 13, No. 3–4, pp. 106–111, 1988.
D. G. Messerschmitt, L. C. Barbosa and T. D. Howell, "A Study of Sampling Detectors for Magnetic Recording," IBM Research Report, RJ 4081, Jul. 16, 1984.
J. Salz, "Optimum Mean–Square Decision Feedback Equalization," Bell System Tech. Journ., vol. 52, No. 8, pp. 1341–1373, Oct. 1973.
R. M. Gray, "On the Asymptotic Eigenvalue Distribution of Teoplitz Matrices," IEEE Trans. Inform. Theory, vol. IT–18 No. 6, pp. 725–730, Nov. 1972.

(List continued on next page.)

Primary Examiner—Benedict V. Safourek
Assistant Examiner—Hai H. Phan
Attorney, Agent, or Firm—Eugene I. Shkurko; Arthur J. Samodovitz

[57] ABSTRACT

Linear and decision feedback equalizers which are communication receivers used in computer systems having an ISI receiver system and analysis paradigm to provide the ability of estimating the performance of these receivers under mismatched channel conditions. The mean square error (MSE) performance of linear and decision feedback equalizers in the presence of arbitrary channel mismatch is presented. A generic equalizer which has feed-forward and feedback taps which are optimized for a mean square error (MSE) criterion. The ability to rapidly predict MSE performance also leads to the real-time adaptation of the equalizer complexity to improve MSE performance, optimal truncation of channel impulse response based on an MSE criterion, and assessing the impact of assuming white noise in a colored noise environment. With the system and method there is a determination of the spectral characteristics of the communication channel during training and/or decoding. These are either known in advance via models and/or experimentation, or they are estimated and/or measured on-line on a periodic schedule. Once this data is obtained, the MSE estimation paradigm is used to predict the MSE performance of the linear or DFE receiver. Among the areas of application is the area of optical and wireless communication systems, such as mobile cellular systems, satellite systems, and wireless indoor networks. Since the physical channel in wireless systems is susceptible to many variations, the receiver is usually operating with inaccurate channel estimates.

23 Claims, 6 Drawing Sheets

OTHER PUBLICATIONS

T. Berger and D. W. Tufts, "Optimum Pulse Amplitude Modulation Part I: Transmitter–Receiver Design and Bounds from Information Theory," IEEE Trans. Inform. Theory, vol. IT–13, No. 2, pp. 196–208, Apr. 1967.

P. A. M. Bune "A Fast Coefficient Computation Algorithm for Transversal and Decision–Feedback Equalizers" Standard Eleckrik Lorenz AG, Central Research Department.

Khalid A. Hamied et al. "A New Channel Estimator for Fast Start–Up Equalization" IEEE, vol. 39, No. 2, Feb. 1991.

D. Divsalar, Performance of Mismatched Receivers on Band–Limited Channels, Doctoral Dissertation, UCLA, 1978. Abstract & Intro.

J. A. C. Bingham, The Theory and Practice of Modem Design, New York: John Wiley & Sons, 1988. pp. 248–249 & 294–295.

U. Grenander and G. Szego, Toeplitz Forms and Their Applications, New York: Chelsea Publishing, USA, 1984. pp. 64–67.

J. L. Doob, Sotchastic Processes, New York: John Wiley & Sons, 1953. pp. 160–161.

PSEUDO CODE FOR MSE PERFORMANCE ESTIMATOR

900 BEGIN MSE_ESTIMATOR

910  GET RECEIVER
920  GET H(w)
930  GET N(w)
940  GET Ht(w)
950  GET Nt(w)

960  X(w)   =MAGNITUDE_SQUARED { H(w) }
961  Xt(w)  =MAGNITUDE_SQUARED { Ht(w) }
962  R(w)   = X(w) + N(w)
963  Rt(w)  =Xt(w) + Nt(w)
964  D(w)   =MAGNITUDE_SQUARED { R(w)*Ht(w) − Rt(w)*H(w) }
965  L(w)   =N(w)/R(w) + D(w)/{ Rt(w) * Rt(w) * R(w) }

970  IF RECEIVER = LFE
971     MSE = INTEGRAL { L(w)/(2*PI) }
     ELSE
972     MSE = EXPONENTIAL{ INTEGRAL{ ln{ L(w)/(2*PI) } } }
990  OUTPUT MSE

999 END

FIG.9

SYSTEM AND METHOD OF ESTIMATING EQUALIZER PERFORMANCE IN THE PRESENCE OF CHANNEL MISMATCH

The application is a continuation of application Ser. No. 08/281,547, filed Jul. 27, 1994, now abandoned, which is a continuation of application Ser. No. 07/846,651, filed Mar. 5, 1992, now abandoned.

FIELD OF THE INVENTION

The present inventions relate to linear and decision feedback equalizers which are communication receivers used in computer systems which have applications such as multimedia, modem, optical and magnetic storage devices, and wireless systems. In particular, it relates to a system and method of estimating the performance of these receivers under mismatched channel conditions.

SHORT GLOSSARY OF TERMS

| Term | Definition |
| --- | --- |
| Equalizer | A form of an ISI receiver for channel communication. |
| BER | Bit Error Rate |
| Channel | A channel is any physical media which connects a transmitter and receiver. Functions which are included in transmitter and/or receiver can also be considered part of the channel. Physical media can be air, wire, cable, optical fiber, a magnetic field, etc. |
| DFE(L,M) | A decision feedback equalizer which has L forward taps and M feedback taps, all of which are assumed to be optimized for an MSE criterion. It is illustrated by FIG. 2. |
| ISI | Intersymbol Interference |
| ISI Receiver | A receiver which attempts to eliminate intersymbol interference. |
| LFE(L,M) | A linear equalizer which has L forward taps and M feedback taps, all of which are assumed to be optimized for an MSE criterion. It is illustrated by a second mode in FIG. 2. |
| Mismatch | A receiver which has been optimized for one channel, yet operates under a different channel, is said to operate in the presence of channel mismatch. |
| MSE | Mean square error |
| PAM | Pulse Amplitude Modulation |
| SNR | Signal to Noise Ratio |

REFERENCES USED IN THE DISCUSSION OF THE INVENTIONS

During the detailed description which follows, the following works will be referenced as an aid for the reader.

U.S. PATENT DOCUMENTS

[1] M. K. Gurcan, "Decision Feedback Equalizer and a Method of Operating A Decision Feedback Equalizer," U.S. Pat. No. 4,985,902 Jan. 15, 1991.

OTHER PUBLICATIONS

[2] S. Qureshi, "Adaptive Equalization," *Proc. of the IEEE*, Vol. 73, No. 9, pp. 1349–1387, September 1985.

[3] J. Proakis, *Digital Communications*, New York: McGraw Hill, 1989.

[4] G. W. Davidson, D. D. Falconer and A. U. H. Sheikh, "An Investigation of Block-adaptive Decision Feedback Equalization for Frequency Selective Fading Channels," *Canadian Journ. Elec. and Comp. Eng.*, Vol. 13, No. 3–4, pp. 106–111, 1988.

[5] D. Divsalar, *Performance of Mismatched Receivers on Bandlimited Channels*, Doctoral Dissedation, UCLA, 1978.

[6] D. G. Messerschmitt, L. C. Barbosa and T. D. Howell, "A Study of Sampling Detectors for Magnetic Recording," *IBM Research Report*, RJ 4081, Jul. 16, 1984.

[7] J. A. C. Bingham, *The Theory and Practice of Modem Design*, New York: John Wiley & Sons, 1988.

[8] J. Salz, "Optimum Mean-Square Decision Feedback Equalization," *Bell System Tech. Journ.*, Vol. 52, No. 8, pp. 1341–1373, October 1973.

[9] U. Grenander and G. Szego, *Toeplitz Forms and Their Applications*, New York: Chelsea Publising, USA, 1984.

[10] R. M. Gray, "On The Asymptotic Eigenvalue Distribution of Toeplitz Matrices," *IEEE Trans. Inform. Theory*, Vol. IT-18, No. 6, pp. 725–730, November 1972.

[11] J. L. Doob, *Stochastic Processes*, New York: John Wiley & Sons. 1953.

[12] T. Berger and D. W. Tufts, "Optimum Pulse Amplitude Modulation Pad I: Transmitter-Receiver Design and Bounds from Information Theory," *IEEE Trans. Inform. Theory*, Vol. IT-13, No. 2, pp. 196–208, April 1967.

[13] P. A. M. Bune, "A Fast Coefficient Computation Algorithm for Transversal and Decision Feedback Equalizers," *Eur. Trans. Tele. Related Tech.*, Vol. 2, No. 2, pp. 251–258, March–April, 1991.

[14] K. A. Hamled, M. Rahman, and M. S. El-Hennawey, "A New Channel Estimator for Fast Start-Up Equalization," *IEEE Trans. Commun.*, Vol. 39, No. 2, pp. 177–181, February 1991.

BACKGROUND OF THE INVENTIONS

The fact that linear equalizers have been the focus of a great deal of research in the past several decades is well justified when one considers their simple nature and adequate performance over well-behaved channels. Similarly, decision feedback equalizers (DFE) have also enjoyed practical success due to their simplicity and their ability, unlike linear equalizers, to perform well over channels with spectral nulls. These conclusions are well documented by Qureshi in reference [2] and Proakis in reference [3].

In order to track channel variations, equalizers may operate in a continuously adaptive mode, albeit with significant computational burden as was shown by G. W. Davidson et al. in reference [4]. One method of alleviating the overhead of continuous adaptation is to adapt the equalizer coefficients periodically based on a known training sequence. One problem with this and other practical schemes, however, is that due to channel fluctuations, the receiver is not always optimized for the actual channel, i.e., channel mismatch occurs.

Although the practical importance of channel mismatch warrants theoretical analyses, there are relatively few references which formally address this topic. In his doctoral thesis, Divsalar [5] investigated the impact of channel mismatch on maximum-likelihood (ML) receivers and derived bounds on the error-event probability. Although his analysis imposed few restrictions on the type of channel mismatch, the ML-based formulation does not lend itself to linear or DFE receivers.

A brief analysis which was conducted for linear equalizers in magnetic recording applications is developed in the work of D. G. Messerschmitt et al. [6]. However, due to the narrow scope of their analysis, their particular results do not lead to a simple and broadly applicable implementation.

In a patent by Gurcan in reference [1], a method was described which attempts to optimize the peak reference tap of a DFE in order to optimize its MSE performance. In addition, it was assumed by Gurcan in reference [1] that increasing the number of feed-forward taps could improve performance. While this may be possible under ideal conditions, my results show that this is not always valid under severe channel mismatch conditions.

Other equalizer references such as Davidson et al. [4] and Bingham [7] have resorted to computer simulation to obtain useful performance predictions for equalizers. Indeed, it is evident from the literature that this kind of computer simulation has been a (and perhaps the only) practical means of ascertaining the sensitivity of complex receivers to channel mismatch. However, the computational requirements incurred by these simulations may be quite significant.

Thus, it is clear that existing performance estimators either grossly bound the MSE (by simply ignoring the channel mismatch) or calculate it via cumbersome analyses and/or expensive Monte Carlo simulation techniques, which are not amenable to real-time applications. Therefore, although there are performance estimators which may be of use assuming ideal (no mismatch) conditions, there are no low-cost methods of quickly estimating equalizer performance under arbitrary channel mismatch conditions. The present system and method provides such a solution.

SUMMARY OF THE INVENTIONS

In accordance with the present inventions a system and method is provided with the ability to rapidly predict the mean square error (MSE) performance of linear and decision feedback equalizers in the presence of arbitrary channel mismatch.

The ability to rapidly predict MSE performance also leads to several other improvements which will be detailed. These include but are not limited to the real-time adaptation of the equalizer complexity to improve MSE performance, optimal truncation of channel impulse response based on an MSE criterion, and assessing the impact of assuming white noise in a colored noise environment.

In accordance with the preferred embodiment of the present invention. First, one must determine the spectral characteristics of the communication channel during training and decoding. These are either known in advance via models and/or experimentation, or they are estimated and/or measured on-line on a periodic schedule. Once this data is obtained, the MSE estimation paradigm detailed in the present invention is used to predict the MSE performance of the linear or DFE receiver.

The analysis paradigm of the present invention has been successfully implemented on a variety of computers including simple desktop and large mainframe systems. Based on the performance on these systems, implementing the present invention in real-time applications via common general-purpose processors is highly desirable.

Among the areas of application are use in channel control for data highways. This is the area of optical and wireless communication systems, such as mobile cellular systems, satellite systems, and wireless indoor networks. Since the physical channel in wireless systems is susceptible to many variations, the receiver is usually operating with inaccurate channel estimates.

There are number of multi-media applications which could benefit from the system and method described herein. Head tracking is a problem which would otherwise reduce the effectiveness of read/write equalizer(s).

BRIEF DESCRIPTION OF THE DRAWINGS

My detailed description explains the preferred embodiments of my inventions, together with advantages and features, by way of example with reference to the following drawings.

FIG. 3 shows the magnitude spectrum of a particular test channel as a function of the parameter a.

FIG. 9 shows the pseudocode of the algorithms used in the present invention which estimate the MSE of the LFE or DFE receiver system shown in FIG. 2.

DETAILED DESCRIPTION OF THE INVENTIONS.

Before considering my preferred embodiments in detail, it may be worthwhile to briefly review the analysis paradigm and discuss a simple example.

Figure 1:
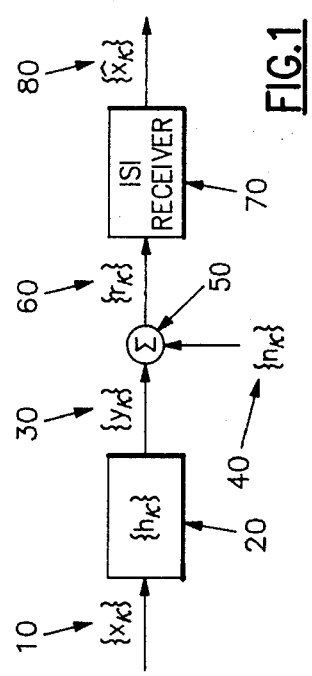
FIG. 1 shows schematically an overview of the popular discrete-time communication system model assumed by the present invention, and utilized in the implementation of my preferred embodiment.

In order to clarify the method, I will consider the simple binary transmission scheme shown in FIG. 1. In the figure, a binary (±1) pulse amplitude modulated (PAM) sequence 10, $x_k$, is transmitted across an equivalent discrete-time channel whose impulse response 20, $\{h_k\}$, is of length $L_c$. The filter output 30, $y_k$, is then summed 50 with a Gaussian noise sequence 40, denoted as $n_k$, which has zero mean. Thus, the received sequence 60, $r_k$, can be expressed as, $$r_k = \sum_{i=0}^{L_c-1} h_i x_{k-i} + n_k \quad (1)$$

It is the goal of the ISI receiver 70 to generate an output 80, $\hat{x}_k$, which is an accurate estimate of the original transmitted signal 10, $x_k$.

Figure 2:
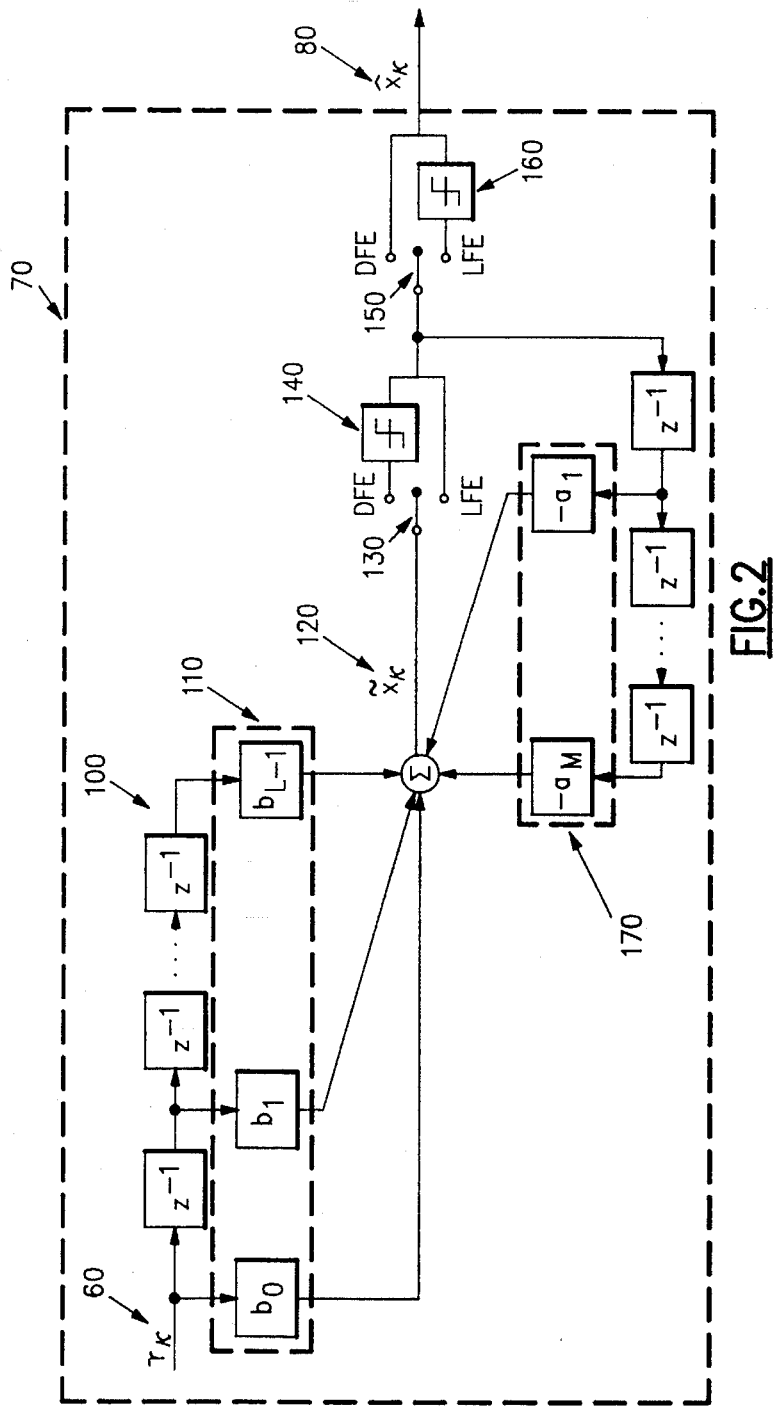
FIG. 2 shows the ISI Receiver of FIG. 1 in more detail, and specifically shows the LFE and DFE receiver systems whose performance under arbitrary channel mismatch can be quickly estimated by the present embodiment of my inventions.

Equalizers form a popular ISI receiver 70 which can be generically depicted by the receiver shown in FIG. 2. For the linear equalizer, the two switches 130, 150 shown are in a first mode in the down position, hence the threshold device 140 is not in the feedback loop. For notational convenience, I will refer to this linear structure as LFE(L,M), where L and M represent the number of taps in the feedforward filter 110 and feedback filter 170, respectively. Since, however, the marginal performance advantage offered by recursive linear equalizers is typically outweighed by their potential instability, as described by Proakis in reference [3], I assume, without loss of generality, that the linear equalizer is a non-recursive type, i.e., LFE(L,0).

By flipping both switches 130,150 up, a second receiver mode is obtained. The non-linear threshold device is 140 is now in the feedback loop, thereby creating the decision feedback equalizer which I will refer to as DFE(L,M). Now, the feedforward filter 110 and feedback filter 170 can be interpreted as a linear equalizer and canceler, respectively, as is described in pad in reference [2]. That is, the received signal 60 is first processed by the Lth-order feedforward filter 110 which attempts to equalize the precursors (samples before the peak sample) of the channel's impulse response. Once the precursors have been equalized, the Mth-order recursive filter 170 mitigates the effect of the postcursors (samples after the peak sample) to also achieve the effects described in reference [8].

In illustration of my preferred system embodiment and given the communication system model defined by FIG. 1, it will be useful to determine with the system of FIG. 2, the resulting MSE performance caused by training an equalizer 70 over a discrete time equivalent channel whose channel filter 20 has spectral data in the form of power spectrum $|H_t(e^{j\omega})|^2$ during training and $|H(e^{j\omega})|^2$ during decoding, and whose spectral data noise sequence 40 has power spectrum $N_t(e^{j\omega})$ during training and $N(e^{j\omega})$ during decoding. When the noise power observed during training differs from that observed during decoding, it is referred to as white gaussian noise mismatch. For illustration here I assume no tap 110 or 170 updates are performed during decoding, although I have illustrated an embodiment a system which exploits the present invention for block-adaptive training schemes.

The present invention yields a fast, accurate estimate to the MSE cost criterion, J, defined as $$J \triangleq E\{(x_k - \tilde{x}_k)^2\} \qquad (2)$$

where $E\{\}$ denotes expectation and $\tilde{x}_k$ is the soft estimate 120 of-the optimally delayed binary input symbol 10, $x_k$.

Linear Equalizer

The MSE of the finite length linear equalizer is known as $$J = J_{min} + J_\Delta \qquad (3)$$

where $J_{min} = 1 - h^T \Gamma^{-1} h$ is the minimum MSE achieved by the optimal tap vector 110, $b_{opt}$, and $$J_\Delta = (b - b_{opt})^T \Gamma (b - b_{opt}) \qquad (4)$$

represents the excess mean square error incurred by an arbitrary coefficient vector 110, b. Here, $\Gamma$ is the received signal 60 covariance matrix during decoding and h is the L-length cross-correlation vector between the transmitted signal 10 and received signal 60.

Let $\Gamma_{RUN}$ and $\Gamma_{TRAIN}$ denote the channel covariance matrices during run-mode and train-mode, respectively. These two matrices, given by $$\Gamma_{RUN} = R + N \quad \Gamma_{TRAIN} = R_t + N_t \qquad (5)$$

determine the optimal tap coefficient vectors 110 $b_{RUN}$ and $b_{TRAIN}$, respectively, $$b_{RUN} = \Gamma_{RUN}^{-1} h \qquad (6)$$

$$b_{TRAIN} = \Gamma_{TRAIN}^{-1} h_t$$

In equation (5), R and $R_t$ represent the L×L covariance matrices of the (deterministic) channel filter 20 during decoding and training, respectively, while N and $N_t$ represent the analogous L×L covariance matrices of the noise sequence 40. Similarly, $h_t$ represents the cross-correlation matrix between the transmitted 10 and received sequence 60 during training.

By direct substitution of these expressions in statement (4), an analysis paradigm which may be employed in one embodiment is the following one which that the MSE due to arbitrary channel mismatch is given by $$J_{66} = [(R_t + N_t)^{-1} h_t - (R+N)^{-1} h]^T [R+N] \, [(R_t + N_t)^{-1} h_t - (R+N)^{-1} h] \qquad (7)$$

The expression in statement (7) yields an exact expression for the excess mean-square error of an LFE(L,0) receiver 70 due to arbitrary channel mismatch. Note that a simpler form than statement (7) is possible for the special case of white Gaussian noise mismatch. In that special case, the channel filter 20 was assumed to be constant, i.e., $h_t = h$ and $R_t = R$ and the noise sequence 40 was assumed to be white, i.e., $N_t = (N_0 + \Delta_n)I$ and $N = N_0 I$, where I is the identity matrix.

Note that since the covariance matrices are symmetric, their eigenvalues can be exposed in statement (7) by the expansions described in reference [9]

$$R = U_R \Lambda_R U_R^{-1} \quad N = U_N \Lambda_N U_N^{-1} \quad R_t = U_{R_t} \Lambda_{R_t} U_{R_t}^{-1} \quad N_t = U_{N_t} \Lambda_{N_t} U_{N_t}^{-1} \qquad (8)$$

Here, the notation $U_Z$ represents the modal matrix of eigenvectors of the symmetric matrix Z, while $\Lambda_Z$ is the diagonal matrix whose diagonal elements are the corresponding eigenvalues of Z. Note that I will designate the ith diagonal element of $\theta_Z$ as $\lambda_Z^i$.

In general, the four modal matrices shown in statement (8) need not be identical for an equalizer 70 of finite dimension. I still, however, prefer to let the equalizer length be large and determine an asymptotic estimate of the MSE. Under this asymptotic assumption, it has been shown by Gray in reference [10] that the covariance matrices are circulant and hence their modal matrices will have the same set of eigenvectors. By noting this, I will express the covariance matrices as $$R = U \Lambda_R U^{-1} \quad N = U \Lambda_N U^{-1} \quad R_t = U \Lambda_{R_t} U^{-1} \quad N_t = U \Lambda_{N_t} U^{-1} \qquad (9)$$

where the elements of U are $$U(m,n) = \frac{1}{\sqrt{L}} e^{-j2\pi mn/L}$$

Now, by substituting (9) in (7) and performing a derivation, I have applied the Toeplitz distribution theorem described by Grenander and Szego in reference [9] Accordingly, I provide in accordance with my preferred embodiment that the calculation of the total mean square error of the infinite length linear equalizer 70 is given by $$J_{LFE(\infty,0)} = \frac{1}{2\pi} \int_{-\pi}^{\pi} \frac{N(e^{j\omega})}{|H(e^{j\omega})|^2 + N(e^{j\omega})} + \qquad (10)$$

-continued $$\frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} d\omega$$

The expression shown in (10) is an original result which yields the MSE performance of a linear equalizer 70 in the presence of arbitrary channel mismatch. Note that the result in equation (10) is an exact solution. However, I also recognize that equation (10) can be used in a form in which it degenerates to for the special case of white Gaussian noise mismatch by setting $N(e^{j\omega})=N_0$, $N_t(e^{j\omega})=N_0+\Delta_n$, and $H_t(e^{j\omega})=H(e^{j\omega})$. In addition, note that the ideal case of no mismatch is also found by the above equation by setting $N(e^{j\omega})=N_t(e^{j\omega})=N_0$ and $H_t(e^{j\omega})=H(e^{j\omega})$.

Decision Feedback Equalizer

By assuming the threshold device 140 makes correct past decisions, a tractable solution for the DFE receiver is also possible. As long as the power spectrum of the received pulse 60 meets certain mild conditions as described by Salz [8] and Doob [11], the asymptotic DFE solution can, in accordance with my inventions, be obtained from the LFE solution. Thus, by using the expression in (10) and applying a derivation the result is that the total MSE incurred by the DFE($\infty,\infty$) receiver 70 may be obtained in accordance with the analysis paradigm given by $$J_{DFE(\infty,\infty)} = \exp\left\{ \frac{1}{2\pi} \int_{-\pi}^{\pi} \ln\left[ \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \right] d\omega \right\} \quad (11)$$

Note that the above result also degenerates for the MSE expression for the special case of white noise mismatch, and to the well-known result for the ideal case of no mismatch which was found by Salz in reference [8].

Example

Figure 3:
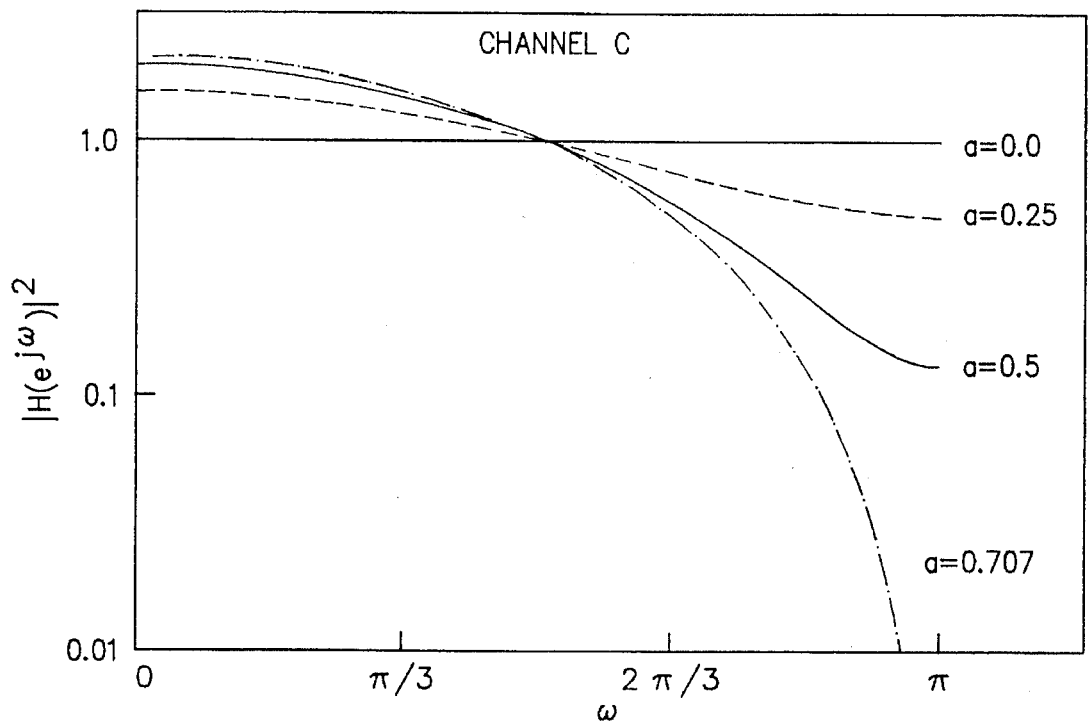

In order to gain further insight on the impact of arbitrary channel mismatch, I have investigated the performance for an illustrative channel filter 20. Specifically, the transfer function of this particular test channel 20 is $$H(z) = \sqrt{1-a^2} + az^{-1} \quad (12)$$

and its magnitude spectrum is given in FIG. 3 for various values of a. In FIGS. 3–8 test channel 20 is shown for "Channel C".

For ease of illustration, I can restrict the noise sequence 40 to be white noise, i.e., $N(e^{j\omega})=N_0$ and $N_t(e^{j\omega})=N_0+\Delta_n$. Note that there is no loss of generality by this restriction since colored noise can be whitened by appropriately modifying the channel filter 20. Thus, I will determine the impact of changing the parameters a and $\Delta_n$ during training.

Simulation Description

A simulation was performed. The parameter a was modified during training as well as the noise parameter $\Delta_n$. For each equalizer, a recursive least-squares (RLS) algorithm was implemented to train the equalizer 70. The equalizer 70 was first trained with a pseudo-random binary data ($\pm 1$) input sequence 10 until the tap vectors 110 and 170 converged. The trained equalizer 70 was then used to decode a pseudo-random binary data sequence 10 until at least 100 bit errors occurred.

Test Results

My theoretical predictions and simulation results for the test channel 20 can be and are shown in FIG. 4 through FIG. 8. In those figures, predicted MSE curves for the LFE($\infty$, 0) and DFE($\infty,\infty$) receivers were calculated by numerically integrating equations (10) and (11), respectively. The DFE was tested in all cases both with and without correct decisions 140. The ordinate axis for each plot is labeled using $a_{TRAIN}$ which is the value of the parameter a during training, or $SNR_{TRAIN}$ which is the SNR during training.

Figure 4:
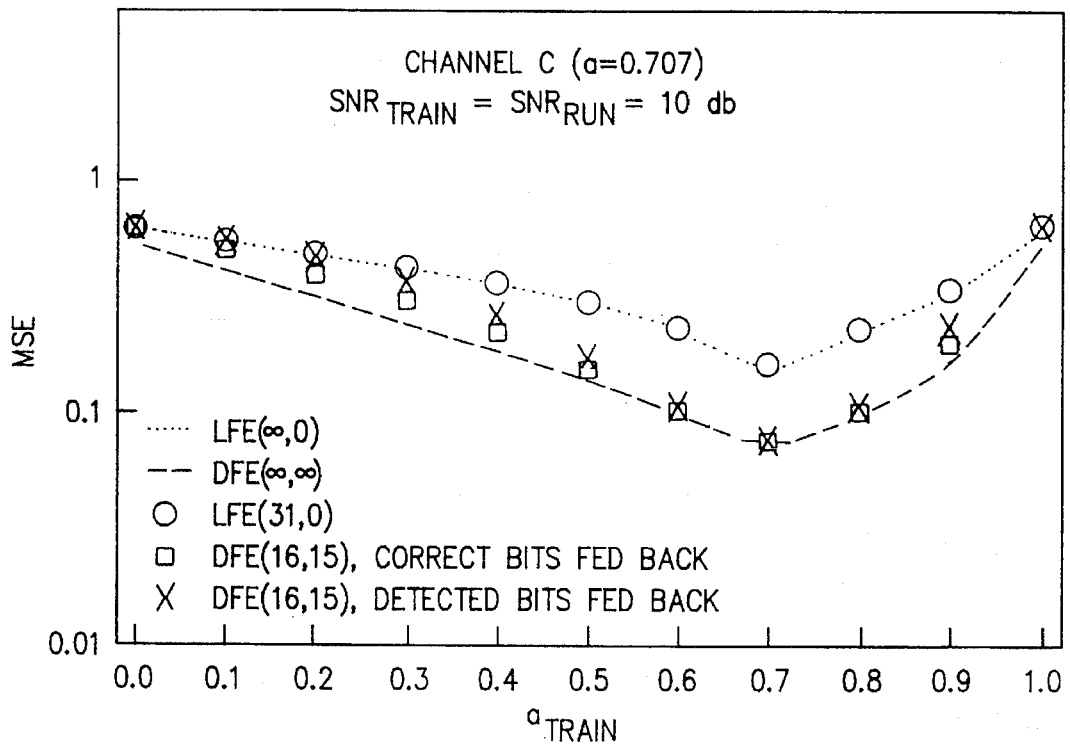
FIG. 4 shows the accuracy of the present embodiment of my invention over the test channel shown in FIG. 3, when only the channel filter is mismatched.

FIG. 4 shows the accuracy of the present invention over the test channel shown in FIG. 3, when only the channel filter is mismatched. The SNR during training and decoding were kept constant for this particular test to isolate the impact of changing the channel filter by the parameter $a_{TRAIN}$ shown on the chart.

Figure 5:
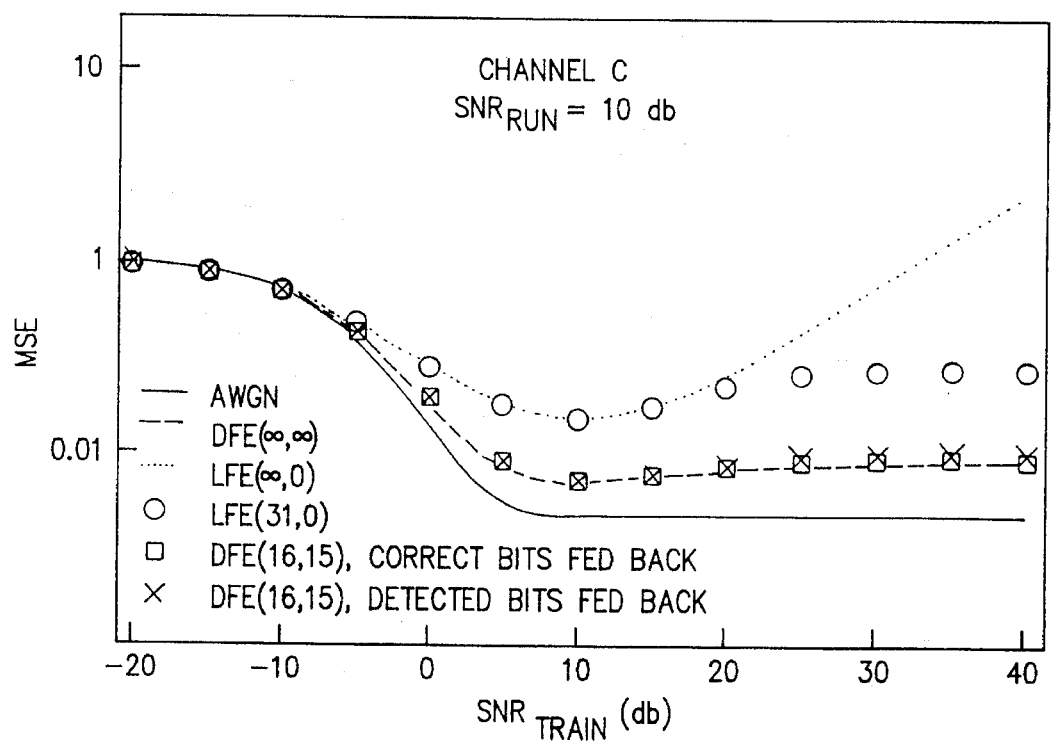
FIG. 5 shows the accuracy of the present embodiment of my invention over the test channel shown in FIG. 3, when only the noise variance is mismatched.

FIG. 5 shows the accuracy of the present invention over the test channel shown in FIG. 3, when only the noise variance is mismatched. In this test, the channel filter remained constant and only the noise variance was changed. Note the important phenomenon which occurs in the LFE receiver when $SNR_{TRAIN}$ is greater than roughly 20 db. This is further detailed in FIG. 6.

Figure 6:
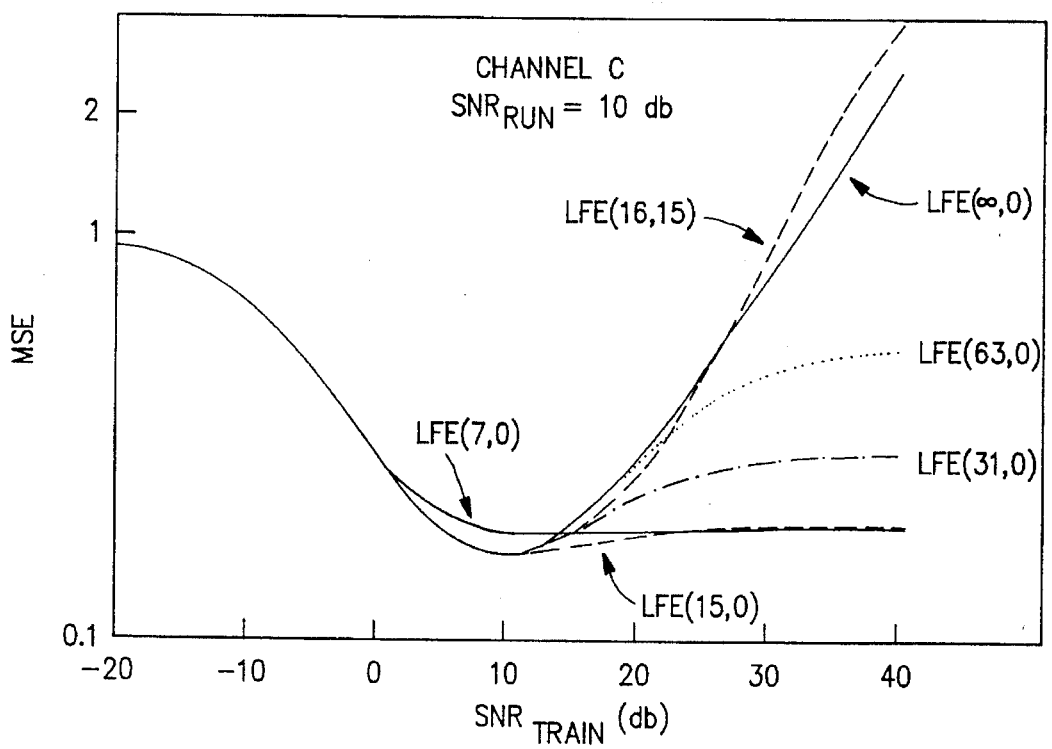
FIG. 6 shows the impact of complexity on MSE performance for the test channel shown in FIG. 3, when only the noise variance is mismatched.

FIG. 6 shows the impact of complexity on MSE performance for the test channel shown in FIG. 3, when only the noise variance is mismatched. This is the same test as that shown in FIG. 5, but with linear receivers of varying complexity.

Figure 7:
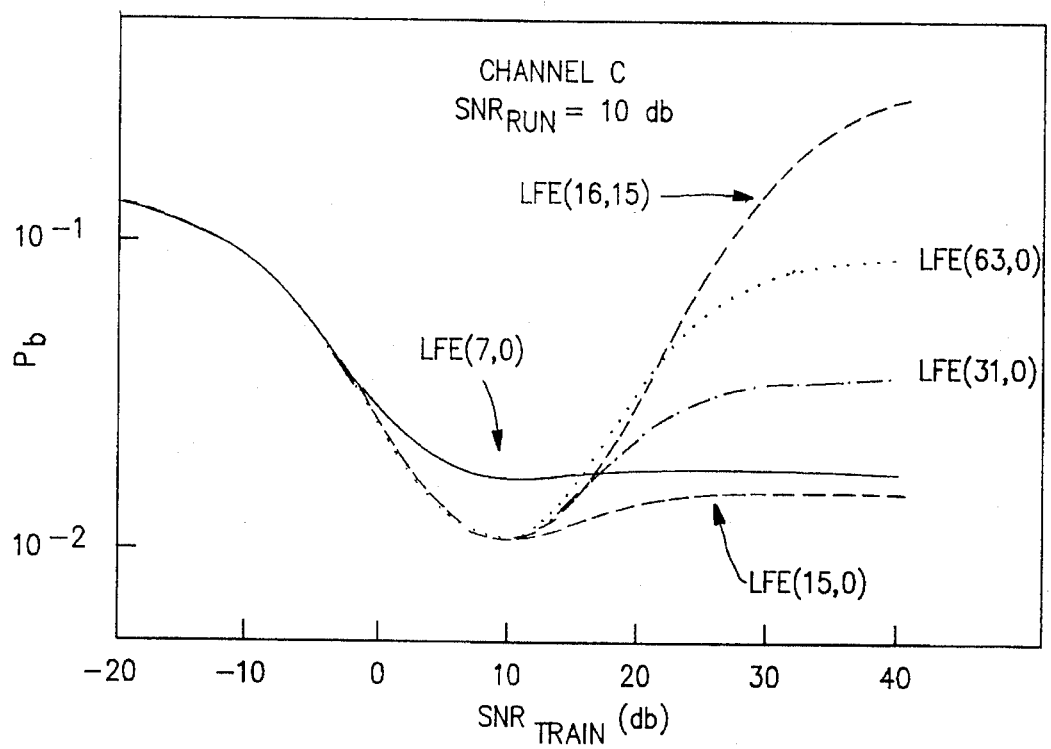
FIG. 7 shows the impact of complexity on BER performance for the test channel shown in FIG. 3, when only the noise variance is mismatched.

Since a bit error analysis is intractable for ISI receivers, as described by Proakis in reference [3], my tests were also used to determine the impact of channel mismatch on the probability of bit error, $P_b$. FIG. 7 shows the impact of complexity on BER performance for the test channel shown in FIG. 3, when only the noise variance is mismatched. Note that the same conclusions drawn from the MSE curves of FIG. 6 are made for BER curves of FIG. 7.

Figure 8:
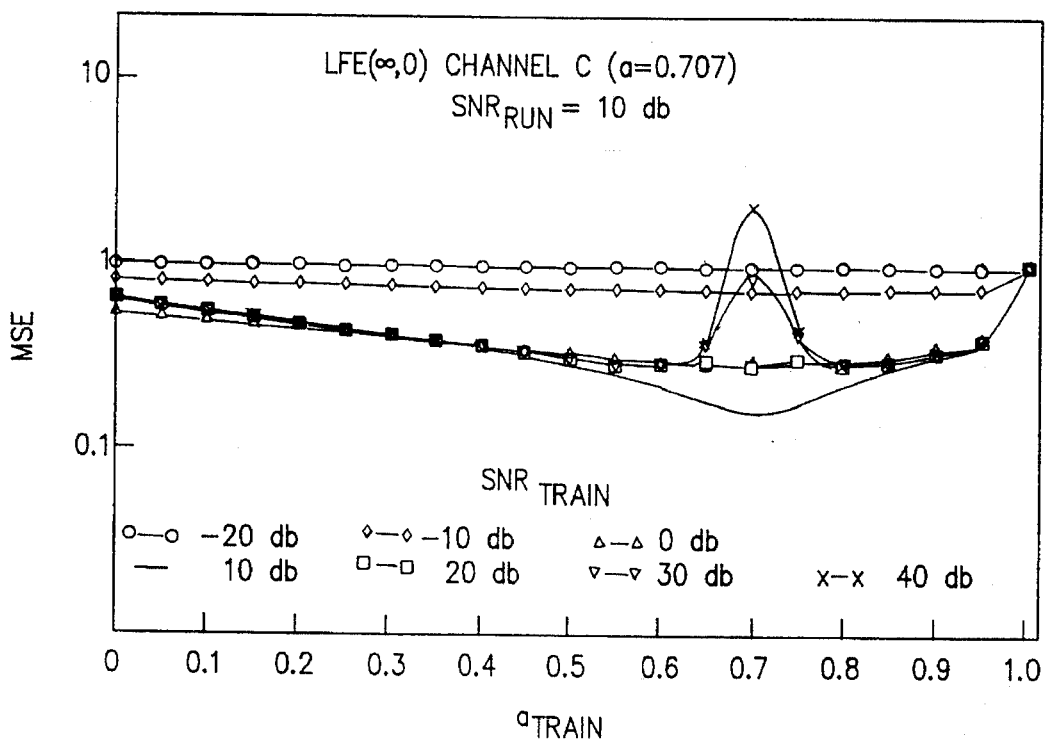
FIG. 8 shows the MSE performance projections when both the channel filter and noise variance are mismatched over the test channel of FIG. 3.
Figure 10:
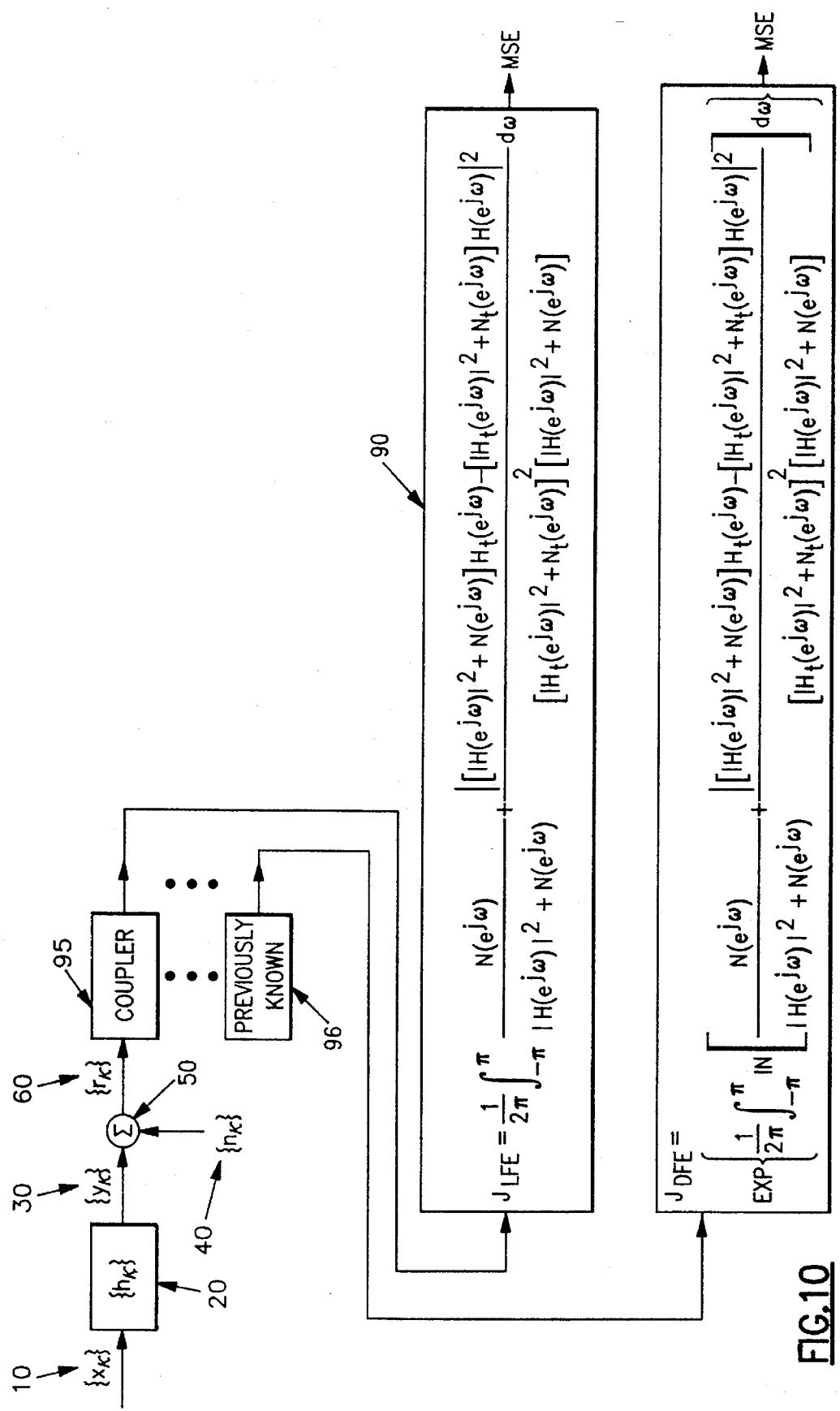

FIG. 8 shows the MSE performance projections for both spectral and noise mismatch over the test channel of FIG. 3.

There are several general observations which can be made from my described theoretical and test results.

1. Test Results Support Paradigm Predictions—My empirical results show that the analysis paradigms and my system which employs the paradigm in hardware, firmware, or software, or a combination, are a reasonable means of predicting performance of equalizers in the presence of arbitrary mismatch. The formulas for both linear and decision feedback equalizers resulted in a good fit for the experimental data under a wide range of channel mismatch.

2. Paradigm Predictions are Estimates, Not Bounds—In the ideal case of no channel mismatch, the paradigm yields well known performance bounds already shown by Berger and Tufts in reference [12] and Salz in reference [8]. Under these ideal conditions, it is appropriate to assume that increasing the number of taps 110 170 will lead to improved performance, as Gurcan reports in his patent [1]. However, I consider that Gurcan's report in his patent are inaccurate. Since channel mismatch is always present under practical conditions, these bounds may be grossly in error, and in fact, I have proven this experimentally. I have shown in FIG. 6 and 7 that my low-complexity receivers may actually outperform high-complexity receivers under some realistic scenarios. These receiver systems are of use for a multi-media, modem, optical and magnetic storage devices such as disc, and in wireless systems, such as wireless LANS and wide area networks.

3. MSE Is A Useful Performance Metric—By comparing the MSE curves of FIG. 7 and the BER curves of FIG. 8, it is clear that conclusions based on the MSE metric would be extremely useful in the optimization of BER performance. Thus, not only does my system provide with the illustrated paradigm a fast method of estimating MSE performance under arbitrary channel mismatch conditions, but the system and methods are also useful in optimizing BER performance over many practical cases of interest.

General Applications

The present inventions when implemented provide for prediction of MSE performance of linear and decision feedback equalizers in the presence of arbitrary channel mismatch. The expressions clearly show the relation of the performance as a function of the spectral characteristics of the channel filter and noise 40, and lead to a low-cost and useful method of predicting performance. The system and method I have described is supported by both theoretical arguments and by test results for various test channels.

In addition, based on my test results, it is clear that accurate estimation of performance can be quite useful in the optimization of performance. For example, the formulas derived in the analysis can serve in several useful applications:

1. Impact of Truncated Impulse Response—Several recent efforts have suggested using an estimate of the channel's impulse response to initially set the equalizer's taps 110 170 as described by Bune in reference [13] and by Hamled at al. in reference [14]. For complexity reasons, I think it desirable to truncate the channel impulse response to a suitable length. The expressions found in equations (10) and (11) can be directly used to estimate the degradation caused by truncation, and, more importantly, could be used to determine an optimum truncation length based on an MSE criterion.

2. Colored Noise—Although a white noise assumption makes many analyses tractable and is reasonable in certain practical cases, understanding the impact of colored noise is critical in accurate performance projections. By using the MSE formulas presented herein, one can easily determine the impact of designing to white noise yet operating in colored noise. If the algorithm predicts the degradation due to a white noise assumption is too severe, then design via colored noise assumptions may be necessary.

3. Designing For Channel Mismatch—There are applications such as multimedia and optical and magnetic recording in which designing for the nominal channel can be suboptimum. If one can determine a family of channels in which a system will operate, my method can be used as an aid to provide the optimum 'nominal' channel to use in the design process.

4. Multi-media Applications—Multi-media applications use equalizers to minimize the severe distortion which is created by the storage channel. This channel comprises the actual disk media as well as the read/write head. Since the head is not always on-track, a severe channel mismatch condition can occur which may significantly reduce the effectiveness of the read/write equalizer(s).

5. Multi-media Traffic Communication Channels—Communication highways encompass the area of optical and wireless communication systems, such as mobile cellular systems, satellite systems, and wireless indoor networks. Since the physical channel in wireless systems is susceptible to many variations, the receiver is usually operating with inaccurate channel estimates. Multi-channels are used with similar problems for wired optical and electrical networks and bus-to-bus communication. MSE sequence estimates will provide value.

System Implementation of the Preferred Embodiment

The embodiment of the present invention can be described in greater detail with reference to FIG. 9 which illustrates the algorithm of Equations (10) and (11) in pseudocode. It will be appreciated that this code can be implemented in software, firmware, and hardware in implementing the ISI receiver 70. Before describing each line, I will describe certain common functions which are in the pseudocode.

1. "Magnitude_Squared" function shown in lines 960, 961, and 964 takes as input an arbitrary spectrum, say $H(e^{j\omega})$ and returns the magnitude squared of that spectrum, i.e. $|H(e^{j\omega})|^2$.

2. The value of "PI" shown in line 971 and 972 is the well known value $\pi=3.14159$.

3. The "Integral" function shown in line 971 and 972 takes as input a function $H(e^{j\omega})$ and numerically integrates this function from $\omega=-\pi$ to $\omega=\pi$.

4. The "In" function shown in line 972 returns the natural logarithm of its input.

5. The "Exponential" function shown in line 972 takes as input a value, say $\alpha$, and returns $e^{\alpha}$ where e is the well known value 2.71828.

6. The functions +, −, *, and / represent a means of addition, subtraction, multiplication, and division, respectively.

In FIG. 9, the function in Line 900 begins the analysis paradigm steps for a computer program for implementing my method for estimating equalizer performance in the presence of channel mismatch by initializing pertinent variables, followed by the function in line 910 which retrieves the type of equalizer whose performance is to be predicted. The valid system types are either. LFE or DFE receivers.

The functions in lines 920, 930, 940 and 950 complete the coupling to retrieve the spectra of the channel filter and noise, both during training and decoding, by direct measurement, for coupling the spectral data to the analysis paradigm by providing spectrum analyzer inputs where the spectral data represents the spectral characteristics of the channel filter and noise sequence. The spectra found by the functions in lines 920–950 are then processed to form the intermediate variables found in lines 960, 961, 962, 963, 964, and 965.

Line 970 determines which receiver is being analyzed. If the receiver given in line 910 is an LFE, then line 971 is processed which calculates the MSE for the LFE receiver, and line 972 is skipped. If the receiver given in line 910 is a DFE, then line 971 is skipped, and line 972 is processed which calculates the MSE for DFE receiver.

The return/report of the analysis paradigm's generated value is provided by line 990 of the code. Line 990 outputs the MSE of the receiver defined in line 910 under the mismatch conditions defined by lines 920, 990, 940, and 950. Finally, line 999 terminates the analysis.

While I have described my preferred embodiments of my inventions, it will be understood that those skilled in the ad, both now and in the future, may make make various improvements and enhancements which fall within the scope of the claims which follow. These claims should be construed to maintain the proper protection for the inventions first disclosed.

What is claimed is:

1. A data communication system comprising:
   a linear equalizer;
   a receiving system for use with the linear equalizer for providing a mean square error (MSE) of a performance of the linear equalizer under arbitrary channel mismatch conditions, the receiving system including:
      receiving means for receiving data sent to the communication system, the receiving means including channel means mismatched with the linear equalizer;
      the channel means coupled to the linear equalizer for transmitting to the linear equalizer the data sent to the communication system, the channel means contributing filter and noise components to the data sent to the communication system which causes said arbitrary channel mismatch conditions;
   the linear equalizer including:
      input means coupled to the channel means for receiving the data sent to the communication system transmitted by the channel means and having the filter and noise components contributed by the channel means, the filter components described by $|H_t(e^{jw})|^2$ during a training sequence for the linear equalizer and by $|H(e^{jw})|^2$ during decoding, the noise components described by $N_t(e^{jw})$ during the training sequence and $N(e^{jw})$ during the decoding; and
      means for outputting an approximation of the data sent to the communication system without the filter and noise components;
   the MSE determined according to $$\frac{1}{2\pi} \int_{-\pi}^{\pi} \frac{N(e^{j\omega})}{|H(e^{j\omega})|^2 + N(e^{j\omega})} +$$

-continued
$$\frac{|[|H(e^{j\omega})|^2 + N(e^{j\omega})] H_t(e^{j\omega}) - [|H_t(e^{j\omega})|^2 + N_t(e^{j\omega})] H(e^{j\omega})|^2}{[|H_t(e^{j\omega})|^2 + N_t(e^{j\omega})]^2 [|H(e^{j\omega})|^2 + N(e^{j\omega})]} d\omega.$$

2. A data communication system as claimed in claim 1, wherein the noise components include white gaussian noise and the MSE is determined by setting $N(e^{jw})=N_0$, $N_t(e^{jw})=N_0+\delta_n$, and $H_t(e^{jw})=H(e^{jw})$, where $N_0$ is a noise spectrum during the decoding, and $\delta_n$ represents a difference in the noise spectrum during the training.

3. A data communication system as claimed in claim 1, wherein the filter and noise components are pre-determined from estimated time-domain data or from channel models.

4. A data communication system as claimed in claim 1, wherein the MSE is used to determine optimal truncation of channel impulse responses.

5. A data communication system as claimed in claim 1, wherein the MSE is used to determine a magnitude of error caused by ignoring white noise.

6. A data communication system as claimed in claim 1, wherein the MSE is used to determine design strategies in multi-media and storage applications.

7. A data communication system as claimed in claim 1, wherein the linear equalizer is a Kalman type equalizer or a derivative of the Kalman type equalizer.

8. A data communication system as claimed in claim 1, wherein the data sent to the communication system includes non-binary signalling.

9. A data communication system as claimed in claim 1, wherein the MSE is used for determining an optimal number of feedforward taps in the linear equalizer.

10. A data communication system comprising:
    a decision feedback equalizer.(DFE);
    a receiving system for-use with the DFE for providing a mean square error (MSE) of a performance of the DFE under arbitrary channel mismatch conditions, the receiving system including:
       receiving means for receiving data sent to the communication system, the receiving means including channel means mismatched with the DFE;
       the channel means coupled to the DFE for transmitting to the DFE the data sent to the communication system, the channel means contributing filter and noise components to the data sent to the communication system which causes said arbitrary channel mismatch conditions;
    the DFE including:
       input means coupled to the channel means for receiving the data sent to the communication system transmitted by the channel means and having the filter and noise components contributed by the channel means, the filter components described by $|H_t(e^{jw})|^2$ during a training sequence for the DFE and by $|H(e^{jw})|^2$ during decoding, the noise components described by $N_t(e^{jw})$ during the training sequence and $N(e^{jw})$ during the decoding; and
       means for outputting an approximation of the data sent to the communication system without the filter and noise components;
    the MSE determined according to $$\exp\left\{ \frac{1}{2\pi} \int_{-\pi}^{\pi} \ln\left[ \frac{N(e^{j\omega})}{|H(e^{j\omega})|^2 + N(e^{j\omega})} + \frac{|[|H(e^{j\omega})|^2 + N(e^{j\omega})] H_t(e^{j\omega}) - [|H_t(e^{j\omega})|^2 + N_t(e^{j\omega})] H(e^{j\omega})|^2}{[|H_t(e^{j\omega})|^2 + N_t(e^{j\omega})]^2 [|H(e^{j\omega})|^2 + N(e^{j\omega})]} \right] d\omega \right\}.$$

11. A data communication system as claimed in claim 10, wherein the noise components include white gaussian noise and the MSE is determined by setting $N(e^{jw})=N_0$, $N_t(e^{jw})=N_0+\delta_n$, and $H_t(e^{jw})=H(e^{jw})$, where $N_0$ is a noise spectrum during the decoding, and $\delta_n$ represents a difference in the noise spectrum during the training.

12. A data communication system as claimed in claim 10, wherein the filter and noise components are pre-determined from estimated time-domain data or from channel models.

13. A data communication system as claimed in claim 10, wherein the MSE is used to determine optimal truncation of channel impulse responses.

14. A data communication system as claimed in claim 10, wherein the MSE is used to determine a magnitude of error caused by ignoring white noise.

15. A data communication system as claimed in claim 10, wherein the MSE is used to determine design strategies in multi-media and storage applications.

16. A data communication system as claimed in claim 10, wherein the DFE is a Kalman type equalizer or a derivative of the Kalman type equalizer.

17. A data communication system as claimed in claim 10, wherein the data sent to the communication system includes non-binary signalling.

18. A data communication system as claimed in claim 10, wherein the MSE is used for determining an optimal number of feedforward taps in the DFE.

19. A data retrieval system comprising:
  a storage system having a read/write head for retrieving and receiving data from the storage system;
  a receiving system for providing a mean square error (MSE) of a performance of the storage system, the receiving system including:
    a data channel coupled to the read/write head for carrying the data retrieved from the storage system, the data channel contributing filter and noise components;
    equalizer means coupled to the data channel for receiving the data retrieved from the storage system having the filter and noise components, and for eliminating the filter and noise components from the data retrieved from the storage system, the filter components described by $|H_t(e^{jw})|^2$ during training of the receiving system and by $|H(e^{jw})|^2$ during decoding, the noise components described by $N_t(e^{jw})$ during the training of the receiving system and $N(e^{jw})$ during the decoding, the MSE determined according to $$\frac{1}{2\pi} \int_{-\pi}^{\pi} \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \, d\omega$$

if the equalizer means is a linear equalizer, and according to $$\exp\left\{ \frac{1}{2\pi} \int_{-\pi}^{\pi} \ln\left[ \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \right] d\omega \right\}$$

if the equalizer means is a decision feedback equalizer.

20. A method for operating and evaluating an equalizer, comprising the steps of:
  transmitting an information sequence to the equalizer over an input channel;
  the equalizer receiving an input sequence comprising the information sequence, channel filter spectral data, and channel noise;
  pre-determining and defining the channel filter spectral data according to $|H_t(e^{jw})|^2$;
  training the equalizer according to the pre-determined channel filter spectral data defined by $|H_t(e^{jw})|^2$;
  pre-determining and defining the channel noise according to $N_t(e^{jw})$;
  training the equalizer according to the pre-determined channel noise defined by $N_t(e^{jw})$;
  the equalizer outputting an estimate of the information sequence in response to the input sequence received over the input channel according to channel filter spectral data defined by $|H(e^{jw})|^2$ and channel noise defined by $N(e^{jw})$;
  determining a mean square error of the equalizer according to $$\frac{1}{2\pi} \int_{-\pi}^{\pi} \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \, d\omega$$

the equalizer is a linear equalizer; and
  determining a mean square error of the equalizer according to $$\exp\left\{ \frac{1}{2\pi} \int_{-\pi}^{\pi} \ln\left[ \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \right] d\omega \right\}$$

if the equalizer is a decision feedback equalizer.

21. A program storage device readable by machine, tangibly embodying a program of instructions executable by the machine to perform method steps for evaluating a performance of a receiver by providing a mean square error of the receiver's output, said method steps comprising:
  retrieving receiver data which describes a type of the receiver;
  retrieving filter spectral data which describes characteristics of a receiver input channel filter;
  defining the filter spectral data according to $|H_t(e^{jw})|^2$ during training of the receiver and according to $|H(e^{jw})|^2$ during decoding;
  retrieving noise spectral data which describes noise characteristics of the receiver input channel;
  defining the noise spectral data according to $N_t(e^{jw})$ during the training of the receiver and according to $N(e^{jw})$ during the decoding;
  processing the filter and the noise spectral data to form intermediate variables;
  determining the MSE of the receiver according to $$\frac{1}{2\pi} \int_{-\pi}^{\pi} \frac{N(e^{j\omega})}{|H(e^{j\omega})|^2 + N(e^{j\omega})} + \frac{|[|H(e^{j\omega})|^2 + N(e^{j\omega})]H_t(e^{j\omega}) - [|H_t(e^{j\omega})|^2 + N_t(e^{j\omega})]H(e^{j\omega})|^2}{[|H_t(e^{j\omega})|^2 + N_t(e^{j\omega})]^2 [|H(e^{j\omega})|^2 + N(e^{j\omega})]} \, d\omega$$

if the receiver data indicates that the receiver is a linear equalizer; and
  determining the MSE of the receiver according to $$\exp\left\{\frac{1}{2\pi}\int_{-\pi}^{\pi}\ln\left[\frac{N(e^{j\omega})}{|H(e^{j\omega})|^2+N(e^{j\omega})}+\frac{|[|H(e^{j\omega})|^2+N(e^{j\omega})]H_t(e^{j\omega})-[|H_t(e^{j\omega})|^2+N_t(e^{j\omega})]H(e^{j\omega})|^2}{[|H_t(e^{j\omega})|^2+N_t(e^{j\omega})]^2[|H(e^{j\omega})|^2+N(e^{j\omega})]}\right]d\omega\right\}$$

if the receiver data indicates that the receiver is a decision feedback equalizer.

22. An article of manufacture for use in a computer system having a receiver for receiving transmitted data;

said article of manufacture comprising a computer usable medium having computer readable program code means embodied in said medium, said program code means for causing a computer to effect:

retrieving receiver data which describes a type of the receiver;

retrieving filter spectral data which describes characteristics of a receiver input channel filter;

defining the filter spectral data according to $|H_t(e^{jw})|^2$ during training of the receiver and according to $|H(e^{jw})|^2$ during decoding; retrieving noise spectral data which describes noise characteristics of the receiver input channel;

defining the noise spectral data according to $N_t(e^{jw})$ during the training of the receiver and according to $N(e^{jw})$ during the decoding; processing the filter and the noise spectral data to form intermediate variables;

determining the MSE of the receiver according to $$\frac{1}{2\pi}\int_{-\pi}^{\pi}\frac{N(e^{j\omega})}{|H(e^{j\omega})|^2+N(e^{j\omega})}+\frac{|[|H(e^{j\omega})|^2+N(e^{j\omega})]H_t(e^{j\omega})-[|H_t(e^{j\omega})|^2+N_t(e^{j\omega})]H(e^{j\omega})|^2}{[|H_t(e^{j\omega})|^2+N_t(e^{j\omega})]^2[|H(e^{j\omega})|^2+N(e^{j\omega})]}d\omega$$

if the receiver data indicates that the receiver is a linear equalizer; and determining the MSE of the receiver according to $$\exp\left\{\frac{1}{2\pi}\int_{-\pi}^{\pi}\ln\left[\frac{N(e^{j\omega})}{|H(e^{j\omega})|^2+N(e^{j\omega})}+\frac{|[|H(e^{j\omega})|^2+N(e^{j\omega})]H_t(e^{j\omega})-[|H_t(e^{j\omega})|^2+N_t(e^{j\omega})]H(e^{j\omega})|^2}{[|H_t(e^{j\omega})|^2+N_t(e^{j\omega})]^2[|H(e^{j\omega})|^2+N(e^{j\omega})]}\right]d\omega\right\}$$

receiver is a decision feedback equalizer.

23. A receiving system for use with an adaptive receiver for providing a mean square error value of a performance of the receiver, the receiver for providing an output signal $x'_k$ 80 which is an estimate of a transmitted information sequence $x_k$ 10, in response to an input signal $r_k$ 60 received from a discrete-time equivalent channel which has a linear channel filter 20 having channel filter coefficients being coupled to the transmitted information sequence $x_k$ and additive noise 40, the channel filter coefficients defined by $|H_t(e^{jw})|^2$ during training of the receiver and by $|H(e^{jw})|^2$ during receiver decoding, the additive noise defined by $N_t(e^{jw})$ during the training of the receiver and by $N(e^{jw})$ during the receiver decoding, the MSE defined by $$\frac{1}{2\pi}\int_{-\pi}^{\pi}\frac{N(e^{j\omega})}{|H(e^{j\omega})|^2+N(e^{j\omega})}+\frac{|[|H(e^{j\omega})|^2+N(e^{j\omega})]H_t(e^{j\omega})-[|H_t(e^{j\omega})|^2+N_t(e^{j\omega})]H(e^{j\omega})|^2}{[|H_t(e^{j\omega})|^2+N_t(e^{j\omega})]^2[|H(e^{j\omega})|^2+N(e^{j\omega})]}d\omega.$$

* * * * *